United States Patent [19]
Tada

[11] Patent Number: 5,815,915
[45] Date of Patent: Oct. 6, 1998

[54] METHOD OF PROCESSING SIGNAL WIRES

[75] Inventor: Kozo Tada, Nagano, Japan

[73] Assignees: Citizen Watch Co., Ltd., Tokyo, Japan; Hewlett-Packard Co., Palo Alto, Calif.

[21] Appl. No.: 628,644

[22] PCT Filed: Nov. 4, 1994

[86] PCT No.: PCT/JP94/01860

§ 371 Date: Apr. 19, 1996

§ 102(e) Date: Apr. 19, 1996

[87] PCT Pub. No.: WO95/12967

PCT Pub. Date: May 11, 1995

[30] Foreign Application Priority Data

Nov. 5, 1993 [JP] Japan .................................. 5-299089

[51] Int. Cl.[6] .................................................. H01R 9/00
[52] U.S. Cl. ............................................................ 29/842
[58] Field of Search .......................... 29/743, 872, 868; 140/147; 259/134.4, 134.3 FT; 414/627, 737; 269/21, 903

[56] References Cited

FOREIGN PATENT DOCUMENTS 0 344 366  12/1989  European Pat. Off. .
60-92899   6/1985   Japan .
6-69695    3/1994   Japan .

OTHER PUBLICATIONS

IBM Technical Disclosure Bulletin, vol. 20, No. 7, pp. 2792–2793 "Vacuum Assisted Hand Guided Test Probe" Dec. 1977.

*Primary Examiner*—Carl E. Hall
*Assistant Examiner*—Christopher Goims
*Attorney, Agent, or Firm*—Armstrong, Westerman, Hattori, McLeland, & Naughton

[57] ABSTRACT

Signal wires (14) are attracted into and held by a suction nozzle (20), and the signal wires (14) are positioned to desired positions in this holding state then they are fixed to a circuit board. As a result, the suction nozzle (20) attracts the signal wires (14) along with the air and easily hold them even if distal ends of the signal wires (14) are spatially scattered, e. g., if the wires are somewhat away from the suction nozzle (20). Since the signal wires (14) are attracted into and held by the suction nozzle (20) in such manner, no excessive force is applied to the signal wires (14) above the suction force of the suction nozzle (20) and the signal wires (14) are not cut during transfer even when they are transferred in the holding state.

3 Claims, 4 Drawing Sheets

METHOD OF PROCESSING SIGNAL WIRES

TECHNICAL FIELD

The present invention relates to a method of processing signal wires for holding signal wires flexibly and adapted for operations in fixing the signal wires to a circuit board, etc.

BACKGROUND TECHNOLOGY

FIG. 8 is a view for explaining a prior art method of processing signal wires. Concretely, FIG. 8 shows a head arm assembly 1 of a magnetic disk device for explaining a method of connecting a magnetic head to a control circuit by signal wires.

The head arm assembly 1 comprises magnetic heads 3, 4 and 5, suspensions 6, 7 and 8, an arm body 9, a movable coil 10, a holder 11, and a bracket 12.

The magnetic heads 3, 4 and 5 are components for recording information on and regenerating the information from a magnetic disk, not shown. The suspensions 6, 7 and 8 have the magnetic heads 3, 4 and 5 at their tip ends and apply a load to the magnetic heads 3, 4 and 5. The arm body 9 has a coil attaching portion 9b for fixing the movable coil 10 thereto and a body 9a for rotatably attaching the suspensions 6, 7 and 8 to a pivotal shaft, not shown, by the holder 11.

An FPC (Flexible Printed Circuit) 13 is fixed to the bracket 12, and it is also fixed to the arm body 9 by the holder 11 like the suspensions 6, 7 and 8. The FPC 13 is provided for applying signal wires issued by the magnetic heads 3, 4 and 5 to a control circuit, not shown, by way of signal wires 14, 15 and 16, and it has pads 13a for soldering the signal wires 14, 15 and 16 thereto and the number of pads 13a corresponds to the number of signal wires 14, 15 and 16.

A method of assembling the head arm assembly 1 is described now. A head assembly 17 comprising the magnetic head 3, the suspension 6, and the signal wire 14 is first assembled, and then head assemblies 18 and 19 each comprising the same arrangement as the head assembly 17 are assembled.

Successively, the movable coil 10 is fixed to the coil attaching portion 9b of the arm body 9 by adhesion, etc., and the FPC 13 is likewise fixed to the bracket 12 by adhesion, etc. Thereafter, the head assemblies 17, 18 and 19, the arm body 9 and the bracket 12 are arranged at predetermined positions. Then, a cylindrical portion 11a of the holder 11 is enlarged in its diameter by a ball swaging tool and fixed to all the aforementioned components while it is inserted into all the aforementioned components.

Thereafter, the signal wires 14, 15 and 16 are fixed to the pads 13a of the FPC 13 by soldering so that the assembly of the head arm assembly 1 is completed.

Whereupon, since the signal wires 14, 15 and 16 are normally very thin, and are difficult to be handled and seen by the naked eye, an operator must hold the signal wires 14, 15 and 16 with tweezers while confirming thereof by way of a magnifier. Then the operator carries out the operation for connecting the signal wires 14, 15 and 16 to the FPC 13 while paying very careful attention not to cut these signal wires, namely, he carries out an operation for processing the signal wires.

However, there are the following problems in the prior art method.

In processing the signal wires according to the prior art method, working efficiency is made worse since an operator uses a magnifier. Further, the signal wires are thin and are easily cut, which makes it difficult to adjust the strength of a force to be applied to the signal wires when the signal wires are held with tweezers, and hence a skillful operation is needed.

Meanwhile, even if it is intended to automate the processing operation, it is difficult to keep the signal wires in a constant shape, since the signal wires are very thin, and hence the signal wires (particularly distal ends thereof) are not stabilized in positions thereof. Accordingly, when the distal ends of the signal wires are held by a robot, a high image processing technique is needed. Still further, there is a problem in that it is difficult to control a force to be applied to the signal wires since the strength of each signal wire is weak even if the signal wires are transferred to given positions while the distal ends thereof are held.

The present invention has been made in view of the aforementioned circumstances, and hence it has the following objects, namely, that signal wires can be easily held by an operator, and a force to be applied to the signal wires held by the operator can be automatically adjusted, and the processing operation of the signal wires can be easily automated.

DISCLOSURE OF THE INVENTION

To achieve the above objects, a method of processing signal wires according to the present invention is characterized by attracting and holding the signal wires by a suction nozzle.

As a result, even if distal ends of the signal wires are spatially scattered, e.g. if the signal wires are somewhat away from the suction nozzle, the signal wires together with air are easily attracted into the suction nozzle so that the signal wires are easily held by the suction nozzle.

Further, the present application discloses an invention for a method of processing signal wires for separating a plurality of entangled signal wires. That is, the method is characterized by attracting and holding each of the signal wires by a suction nozzle in a state where each tip end of each signal wire is fixed and each distal end of each signal wire is made free, inserting a separating member between the signal wires in the holding state, and transferring the separating member in a direction of distal ends of the signal wires.

As a result, the plurality of entangled signal wires can be separated without applying any excessive force.

Still further, the present application discloses a method of processing signal wires for separating two entangled signal wires, and inserting the separated signal wires into separate tubes individually. The method is characterized by attracting and holding each of the signal wires by a suction nozzle in a state where each tip end of each signal wire is fixed and each distal end of each signal wire is made free, inserting a separating member between the signal wires in the holding state, and transferring the separating member in a direction of distal ends of the signal wires, and guiding each of the signal wires, which are respectively spaced by a width of the separating member, into each tube.

As a result, an insulating protecting tube, etc., is easily attached to outer peripheries of the signal wires.

Still further, the present application discloses a method of processing signal wires which is characterized by attracting and holding signal wires by a suction nozzle, positioning the signal wires in desired positions in the holding state, and fixing the signal wires to a circuit board.

Since the signal wires together with air are attracted into the suction nozzle and the signal wires are held by the suction nozzle, even if the signal wires are transferred in the holding state, no excessive force above the suction force of the suction nozzle is applied to the signal wires, and hence the signal wires are not easily cut.

BEST MODE FOR CARRYING OUT THE INVENTION

Optimum embodiments of the present invention will be described now with reference to the attached drawings.

FIGS. 1 through 7 are views for explaining the embodiments of the present invention. Components having functions which are the same as or correspond to those shown in FIG. 8 are denoted by the same numerals and explanations thereof are omitted.

Figure 1:
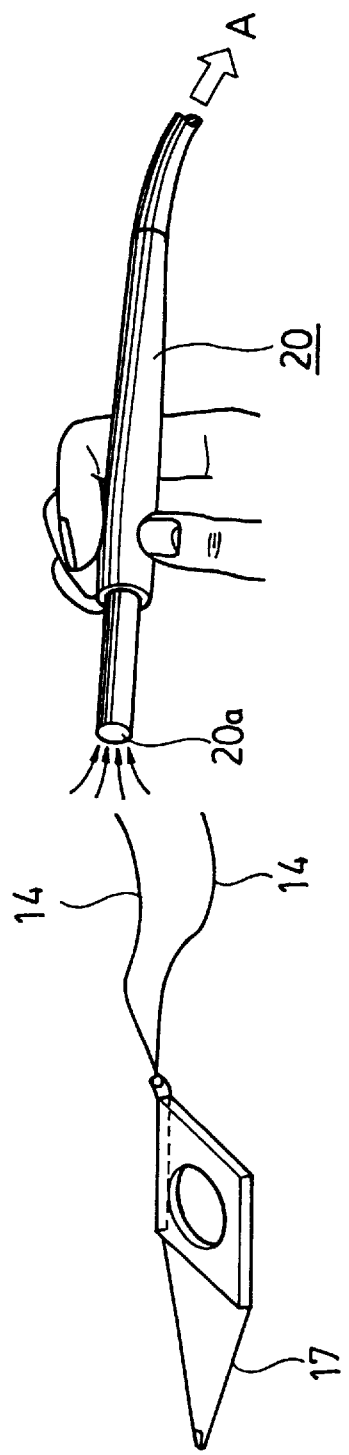
FIG. 1 is a perspective view for explaining a method of processing signal wires according to a first embodiment of the invention.

FIG. 1 is a perspective view for explaining a method of processing signal wires according to a first embodiment of the present invention. The first embodiment discloses a method of processing distal ends of the signal wires by an operator with his or her hand.

That is, interior air of a suction nozzle 20 is attracted in a direction of an arrow A by a vacuum suction device, not shown. When the operator carries the suction nozzle 20 with his hand instead of tweezers, distal ends of the signal wires 14 attached to a head assembly 17 are attracted into and held by the suction nozzle 20 so that the signal wires 14 are positioned at desired positions.

At this time, a suction hole 20a of the suction nozzle 20 is not needed to contact the signal wires 14, and the signal wires 14 together with air around the signal wires 14 are attracted into the suction nozzle 20 and the signal wires 14 are held by the suction nozzle 20 by merely permitting the signal wires 14 to approach a periphery of the suction nozzle 20. Further, since a given suction force acts upon the signal wires 14 even while the signal wires 14 are thereafter transferred to desired positions, it is possible to prevent the signal wires 14 from being cut due to an overload or an excessive force being applied to the signal wires.

FIGS. 2 through 5 are perspective views each showing a method of processing signal wires in order of processing steps thereof according to a second embodiment of the present invention. The second embodiment discloses a method for automatically inserting the signal wires 14 and 14 attached to the head assembly 17 into insulating protecting tubes 30 and 30.

The insulating protecting tubes 30 and 30 protect fixing portions for fixing the signal wires 14 and 14 to suspensions 6, 7 and 8, and they are arranged at given positions inside an automatic suction nozzle 31 by a jig, not shown. The automatic suction nozzle 31 can sufficiently pull the distal ends of the signal wires 14 and 14 thereinto by attracting the air around the signal wires 14 and 14.

A separator jig 34 is a separating member for separating two tangled signal wires 14 and 14 individually so as to insert the separated signal wires 14 and 14 into the separate insulating protecting tubes 30 and 30 individually. A plate jig 33 is an auxiliary jig to be used when the separator jig 34 is inserted between two signal wires.

Figure 2:
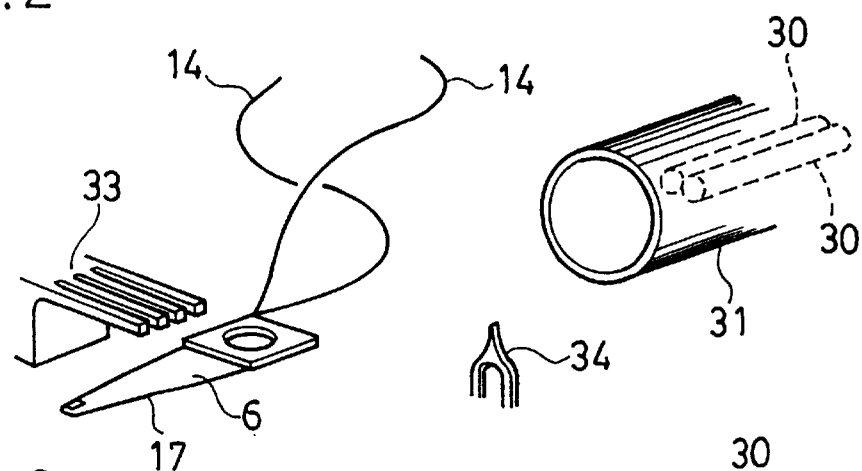
FIG. 2 is a perspective view for explaining a method of processing signal wires according to a second embodiment of the invention.

First, as shown in FIG. 2, each component and each jig are arranged in given positions. At this time, since the two signal wires 14 and 14 are normally tangled as shown in the same figure, the signal wires 14 and 14 cannot be inserted into the insulating protecting tubes 30 and 30 in this tangled state.

Figure 3:
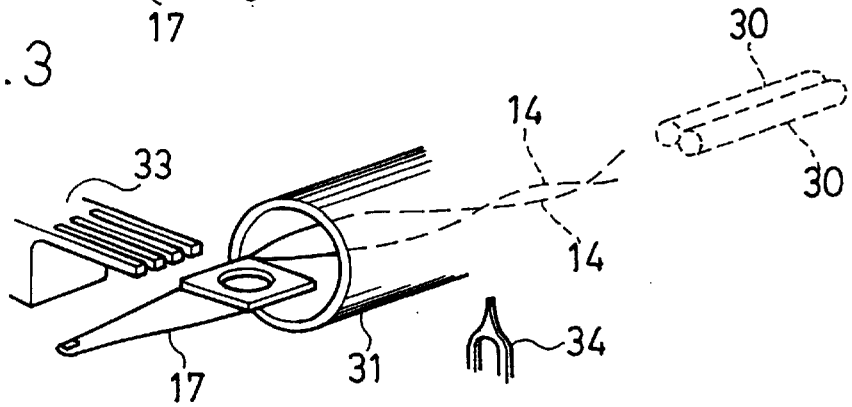
FIG. 3 is a perspective view continued from FIG. 2 for explaining a method of processing signal wires according to the second embodiment of the invention.

Then, as shown in FIG. 3, when the automatic suction nozzle 31 is approached to the signal wires 14 and 14 by an operator, the signal wires 14 and 14 are attracted into the automatic suction nozzle 31 by the suction operation thereof. At this time, although the signal wires 14 and 14 are postured linearly along the flow of air which is attracted into the automatic suction nozzle 31, the two signal wires 14 and 14 are not disentangled yet.

Figure 4:
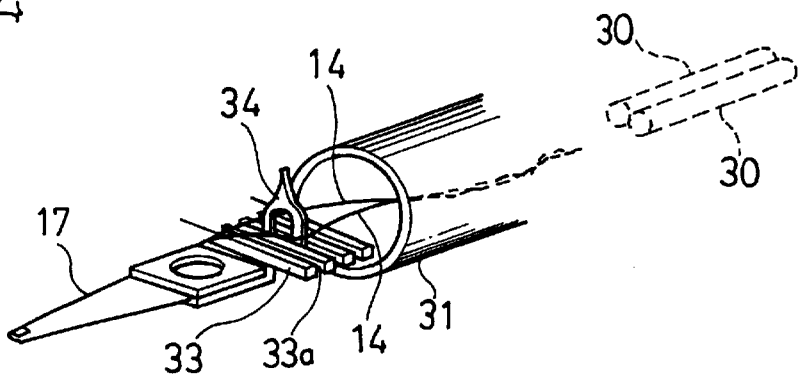
FIG. 4 is a perspective view continued from FIG. 3 for explaining a method of processing signal wires according to the second embodiment of the invention.

Accordingly, as shown in FIG. 4, the plate jig 33 is disposed under the signal wires 14 and 14. The plate jig 33 has a plurality of slits 33a. The separator jig 34 is pointed acutely at an upper end, and is gently widened from the upper end to a middle portion thereof. A width of the middle portion of the separator jig 34 is equal to a distance between the centers of the two insulating protecting tubes 30 and 30 which are arranged inside the automatic suction nozzle 31.

The separator jig 34 is inserted into the two signal wires 14 and 14 at a position close to a connecting portion with the head assembly 17 so as to push and separate the signal wires 14 and 14 with the middle portion thereof. The inserting operation of the separator jig 34 is carried out by permitting the separator jig 34 to pass through the slits 33a of the plate jig 33 and to raise it from the lower side thereof.

Since the two signal wires 14 and 14 are not yet tangled at the position close to a connecting portion with the head assembly 17, when the separator jig 34 is inserted into the two signal wires 14 and 14, the two signal wires 14 and 14 can be subsequently disentangled.

Figure 5:
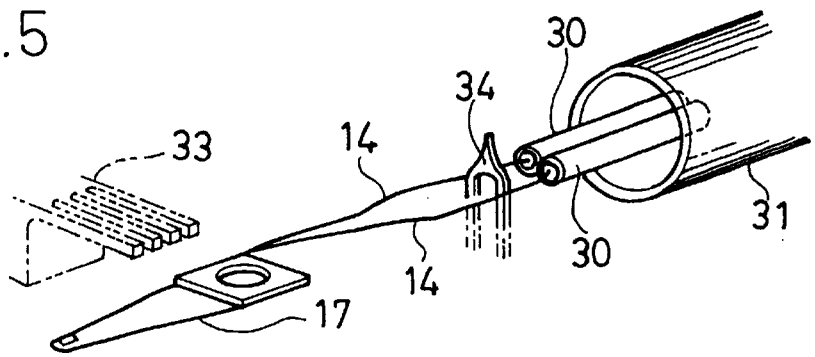
FIG. 5 is a perspective view continued from FIG. 4 for explaining a method of processing signal wires according to the second embodiment of the invention.

That is, as shown in FIG. 5, the plate jig 33 and the separator jig 34 are moved together with the automatic suction nozzle 31 in a direction of the distal ends of the signal wires 14 and 14. As a result, the signal wires 14 and 14 can be disentangled by the separator jig 34.

The insulating protecting tubes 30 and 30 are arranged at positions close to the distal ends of the signal wires 14 and 14. After the signal wires 14 and 14 are disentangled from the tip ends until the distal ends thereof, the automatic suction nozzle 31, plate jig 33 and the separator jig 34 are moved together in a direction of the head assembly 17. As a result, the signal wires 14 and 14 can be inserted from the distal ends thereof into hollow interiors of the insulating protecting tubes 30 and 30.

Upon completion of these operations, the plate jig 33 and the separator jig 34 are moved backward.

The aforementioned operations can be completely automated, or a part of or all of the operations can be carried out by an operator.

Figure 6:
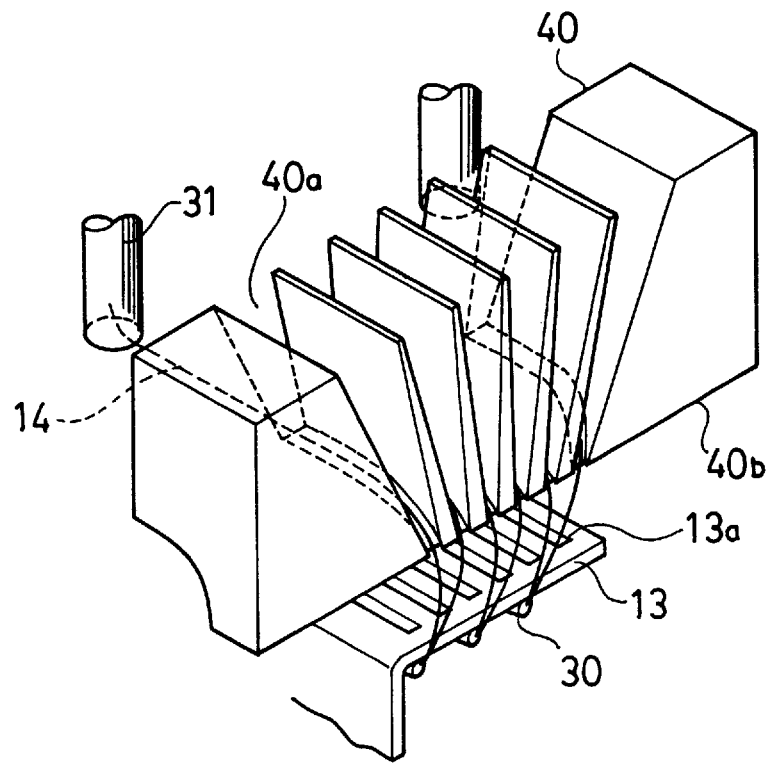
FIG. 6 is a perspective view for explaining a method of processing signal wires according to a third embodiment of the invention.
Figure 7:
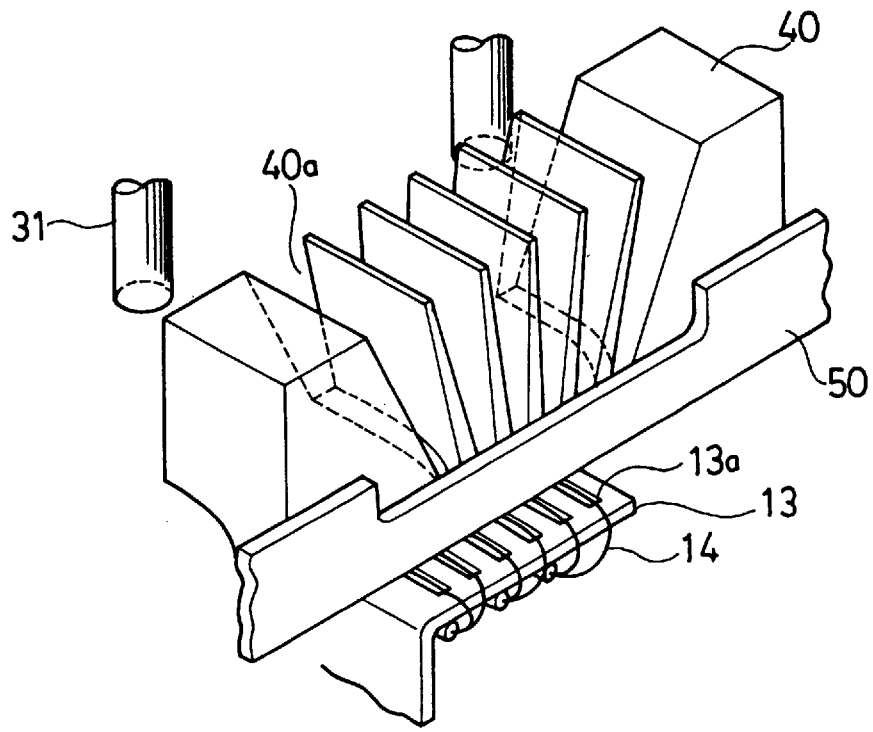
FIG. 7 is a perspective view continued from FIG. 6 for explaining a method of processing signal wires according to the third embodiment of the invention.
Figure 8:
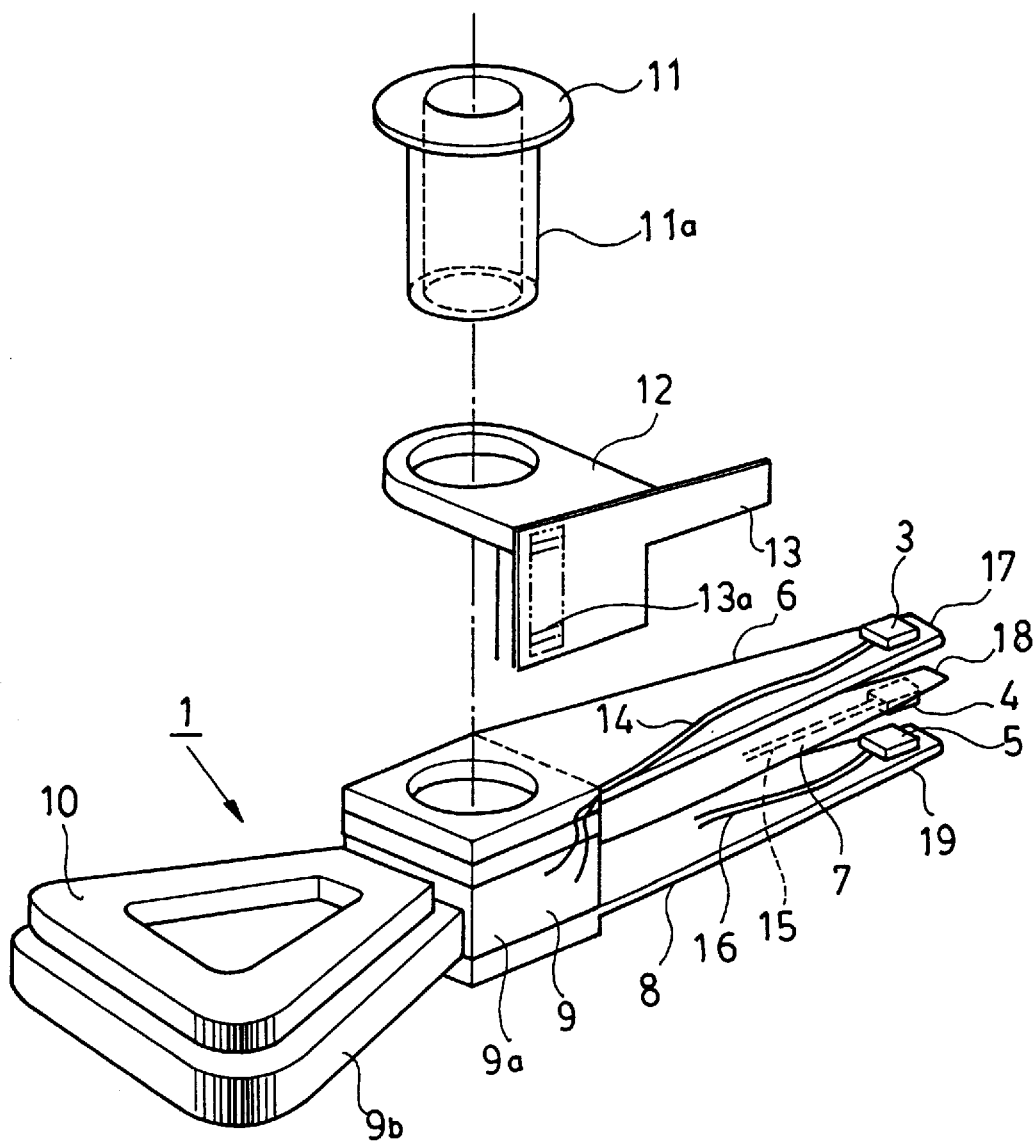
FIG. 8 is a perspective view for explaining a prior art method of processing signal wires.

FIGS. 6 and 7 are perspective views for explaining of a method of processing signal wires according to a third embodiment of the present invention. The third embodiment discloses a method of soldering the distal ends of the signal wires 14 and 14, which are inserted into the insulating protecting tubes 30 and 30 according to the method of the second embodiment, to the pads 13a of the FPC 13.

That is, as shown in FIG. 6, a positioning jig 40 is arranged to confront a surface of the FPC 13 where the pads 13a are formed. At this time, a tip end edge 40b of the positioning jig 40 is arranged behind and spaced slightly remote from tip ends of the pads 13a of the FPC 13. The positioning jig 40 has wedge-shaped concave portions 40a the number of which is the same as that of the pads 13a of the FPC 13 and each width of which corresponds to each distance between the pads 13a.

The signal wires 14 and 14 are attracted into and held by the automatic suction nozzle 31 at positions close to the pads 13a. Then, a tip end opening of the automatic suction nozzle 31 which attracts the signal wires 14 and 14 thereinto is moved to the rear of the positioning jig 40 along the wedge-shaped concave portions 40a. As a result, the signal wires 14 and 14 are arranged in a space extending from the tip end upper portions of the pads 13a to the wedge-shaped concave portions 40a.

After all the signal wires 14 and 14 are arranged in a space extending from the tip end upper portions of the pads 13a to wedge-shaped concave portions 40a by the aforementioned operation, the signal wires 14 and 14 are pressed against the pads 13a using a signal line fixing jig 50 as shown in FIG. 7. In this state, the signal wires 14 and 14 are automatically or manually soldered to the pads 13a.

The present invention is not limited to the aforementioned embodiments but it can be applied to various operations for processing flexible signal wires.

Further, the separating member for separating tangled signal wires is not limited to the separator jig 34 as employed in the second embodiment, but it may selectively have a suitable shape among various shapes depending on a processing content of the signal wires.

As explained above, even if signal wires are very small and weak, the signal wires can be easily held by a suction nozzle by merely permitting the suction nozzle to approach a position close to distal ends thereof utilizing the method of processing the signal wires of the present invention. Even if the distal ends of the signal wires are moved to be positioned to desired positions in such a holding state, no excessive force is applied to the signal wires, and hence the signal wires are not easily cut. Accordingly, even when very small and weak signal wires are to be processed, which was difficult to perform conventionally, it can be easily and suitably carried out, and an automation thereof can be easily realized.

INDUSTRIAL UTILIZATION

The present invention can be utilized for an operation to connect signal wires led from a magnetic head to a control circuit in a manufacturing step of a magnetic disk device, and also utilized for various operations to process flexible signal wires.

According to the present invention, even when very small and weak signal wires are to be processed, which was difficult to perform conventionally, it can be easily and suitably carried out, and an automation thereof can be easily realized.

I claim:

1. A method of processing signal wires for separating a plurality of tangled signal wires, wherein said method comprises attracting and holding, with a suction nozzle, each signal wire in a holding state where each tip end of each signal wire is fixed and each distal end of each signal wire is made free, inserting a separating member between said signal wires while in said holding state, and moving said separating member in a direction of distal ends of said signal wires.

2. A method of processing signal wires for separating two tangled signal wires and inserting said separated signal wires into separate tubes individually, said method comprising attracting and holding each of said signal wires by a suction nozzle in a holding state where each tip end of each signal wire is fixed and each distal end of each signal wire is made free, inserting a separating member, which has a width corresponding to a distance between centers of said tubes, between said signal wires while in said holding state, moving said separating member in a direction of distal ends of said signal wires, and guiding each signal wire, which is spaced by a width corresponding to the width of said separating member, into each tube.

3. A method of processing signal wires for fixing and electrically connecting said signal wires to a circuit board, said method comprising attracting and holding said signal wires in a holding state by a suction nozzle, positioning said signal wires to desired positions while in said holding state, and fixing said signal wires to said circuit board wherein said positioning individually separates each of the signal wires into the respective desired positions.

* * * * *